(12) United States Patent
Sakai

(10) Patent No.: US 9,799,506 B2
(45) Date of Patent: Oct. 24, 2017

(54) BREAKDOWN VOLTAGE MEASURING METHOD AND METHOD FOR MANUFACTURING SEMICONDUCTOR DEVICE

(71) Applicant: Sumitomo Electric Industries, Ltd., Osaka-shi (JP)

(72) Inventor: Mitsuhiko Sakai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 282 days.

(21) Appl. No.: 14/699,575

(22) Filed: Apr. 29, 2015

(65) Prior Publication Data

US 2015/0348774 A1 Dec. 3, 2015

(30) Foreign Application Priority Data

Jun. 2, 2014 (JP) ................................ 2014-114040

(51) Int. Cl.
*H01L 21/02* (2006.01)
*H01L 21/66* (2006.01)
*B08B 3/08* (2006.01)

(52) U.S. Cl.
CPC .......... *H01L 21/02057* (2013.01); *B08B 3/08* (2013.01); *H01L 22/14* (2013.01)

(58) Field of Classification Search
CPC ............................ H01L 21/02057; B08B 3/08
See application file for complete search history.

(56) References Cited

U.S. PATENT DOCUMENTS

2011/0294278 A1* 12/2011 Eguchi .................. H01L 23/544
438/800

FOREIGN PATENT DOCUMENTS

JP          2003-100819 A    4/2003
WO    WO-2010/021070 A1    2/2010

OTHER PUBLICATIONS

Machine translation: WO 2010/021070; Kusumoto et al.; Feb. 25, 2010.*
3M(TM) Novec(TM) 7100 Engineered Fluid—Product Information Sheet; 2009.*

* cited by examiner

*Primary Examiner* — Michael Kornakov
*Assistant Examiner* — Natasha Campbell
(74) *Attorney, Agent, or Firm* — Venable LLP; Michael A. Sartori; Miguel A. Lopez

(57) ABSTRACT

A breakdown voltage measuring method includes the steps of measuring a breakdown voltage of a semiconductor element in a state where a surface of the semiconductor element formed in a semiconductor substrate is covered with a high boiling point fluorine fluid having a boiling point of 90° C. or higher, and cleaning the semiconductor substrate, including the semiconductor element for which the breakdown voltage is measured, with a low boiling point fluorine inert fluid having a boiling point of 80° C. or lower. Accordingly, a breakdown voltage measuring method capable of suppressing generation of an electric discharge during the measurement of the breakdown voltage and suppressing a residue of a foreign object on the cleaned semiconductor substrate, and a semiconductor device to which the breakdown voltage measuring method is implemented are provided.

7 Claims, 6 Drawing Sheets

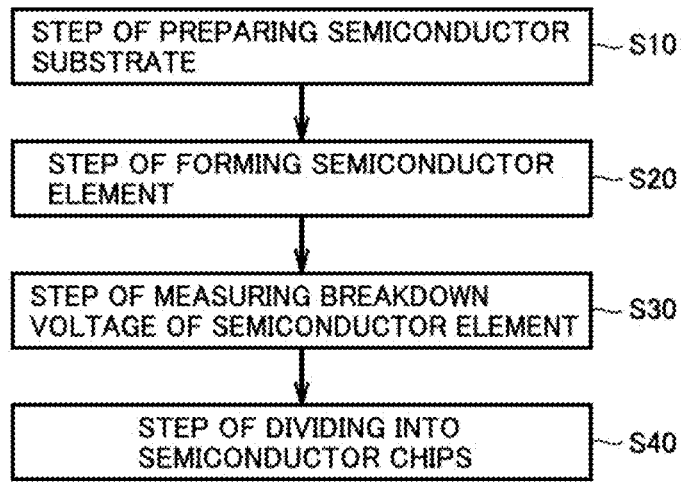
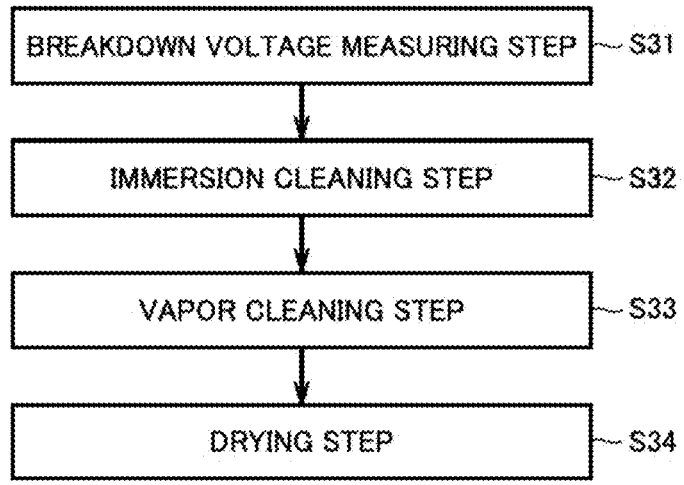

BREAKDOWN VOLTAGE MEASURING METHOD AND METHOD FOR MANUFACTURING SEMICONDUCTOR DEVICE

BACKGROUND OF THE INVENTION

Field of the Invention

The present invention relates to a breakdown voltage measuring method and a method for manufacturing a semiconductor device. More particularly, the present invention relates to a breakdown voltage measuring method capable of suppressing generation of an electric discharge during a measurement of a breakdown voltage and suppressing a residue of a foreign object on a cleaned semiconductor substrate, and to a method for manufacturing a semiconductor device to which the breakdown voltage measuring method is implemented.

Description of the Background Art

For a semiconductor device, particularly for a power semiconductor device, a breakdown voltage is one of significant properties. Therefore, in a method for manufacturing a semiconductor device, there is a case where a breakdown voltage of a semiconductor element formed in a semiconductor substrate is measured. When a condition for the measurement of the breakdown voltage is inappropriate, there is a case where a creeping discharge is generated from a measuring probe on the semiconductor substrate so that the semiconductor element is broken. Therefore, it would be necessary to suppress generation of the electric discharge during the measurement of the breakdown voltage to prevent the breaking of the semiconductor element.

As a method for preventing the breaking of the semiconductor element due to the electric discharge described above, there has been a known method of performing the measurement of the breakdown voltage of the semiconductor element with use of an insulating solution. For example, Japanese Patent Laying-Open No. 2003-100819 discloses a method of measuring the breakdown voltage of the semiconductor element in a state where the semiconductor element is immersed in the insulating solution. Moreover, WO2010/021070 discloses a method of measuring the breakdown voltage of the semiconductor element in a state where the insulating solution is applied to a surface of a part of the semiconductor substrate by potting.

SUMMARY OF THE INVENTION

In the conventional breakdown voltage measuring methods illustrated in Japanese Patent Laying-Open No. 2003-100819 and WO02010/021070 described above, organic solvent cleaning or cleaning by pure water is applied to the semiconductor substrate after completion of the measurement of the breakdown voltage of the semiconductor element. Then, nitrogen gas or the like is blown onto the surface of the cleaned semiconductor substrate, so that the surface of the semiconductor substrate is dried.

However, in the breakdown voltage measuring methods described above, there has been a problem that a foreign object adheres to the dried surface of the semiconductor substrate and resides on the same. This foreign object may be made when a needle of the measuring probe is brought to be in contact with a pad electrode of the semiconductor element and the pad electrode is cut during the measurement of the breakdown voltage, or the foreign object inevitably enters the insulating solution. Moreover, in the breakdown voltage measuring method described above, an insulating solution having a high boiling point (in other words, a high viscosity) is used to suppress reduction of the fluid amount due to evaporation. Therefore, there has been a problem that the foreign object readily adheres to the dried surface of the semiconductor substrate and resides thereon due to the high viscosity of the insulating solution. Accordingly, in view of improving a yield of a semiconductor device, a method for suppressing a residue of a foreign object on the cleaned semiconductor substrate is requested.

Therefore, an object of the breakdown voltage measuring method according to one form of the present invention is to suppress generation of an electric discharge during a measurement of a breakdown voltage and suppress a residue of a foreign object on a cleaned semiconductor substrate. Moreover, an object of a method for manufacturing a semiconductor device according to one form of the present invention is to improve a yield of the semiconductor device.

A breakdown voltage measuring method according to one form of the present invention includes the steps of measuring a breakdown voltage of a semiconductor element in a state where a surface of the semiconductor element formed in a semiconductor substrate is covered with a high boiling point fluorine inert fluid having a boiling point of 90° C. or higher, and cleaning the semiconductor substrate, including the semiconductor element for which the breakdown voltage is measured, with a low boiling point fluorine inert fluid having a boiling point of 80° C. or lower.

A method for manufacturing a semiconductor device according to one form of the present invention includes the steps of preparing a semiconductor substrate in which a semiconductor element is formed, and measuring a breakdown voltage of the semiconductor element. In the step of measuring a breakdown voltage of the semiconductor element, the breakdown voltage measuring method according to one form of the present invention described above is implemented to measure the breakdown voltage of the semiconductor element.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flowchart schematically representing a method for manufacturing a semiconductor device according to one embodiment of the present invention.

FIG. 2 is a flowchart schematically representing a breakdown voltage measuring method according to one embodiment of the present invention.

DESCRIPTION OF THE PREFERRED EMBODIMENTS

Figure 3:
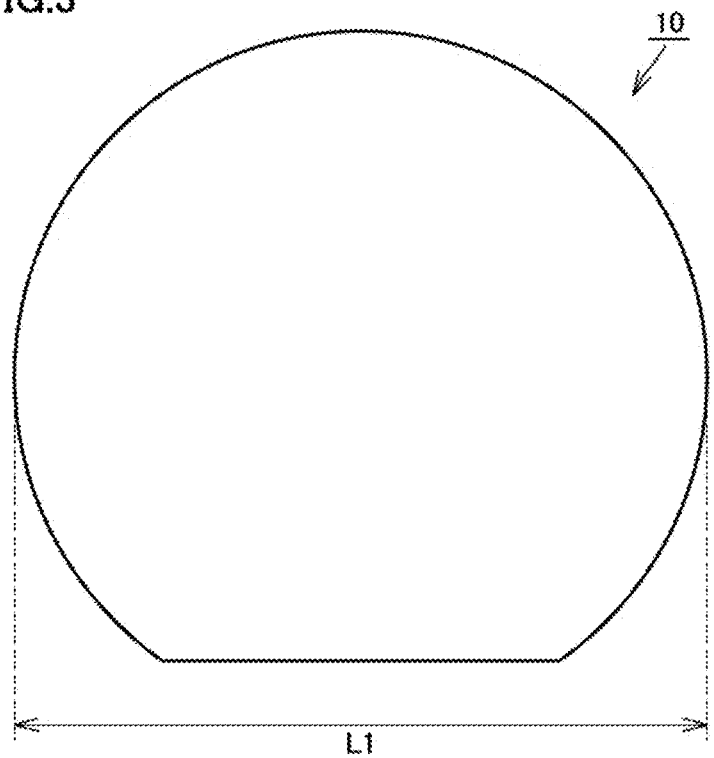
FIG. 3 is a schematic plan view representing a semiconductor substrate for use in the method for manufacturing the semiconductor device according to one embodiment of the present invention.

Description of the Embodiment of the Present Invention

Firstly, embodiments of the present invention will be listed and described.

(1) A breakdown voltage measuring method according to one form of the present invention includes the steps of measuring a breakdown voltage of a semiconductor element 11 in a state where a surface of semiconductor element 11 formed in a semiconductor substrate 10 is covered with a high boiling point fluorine inert fluid 30 having a boiling point of 90° C. or higher, and cleaning semiconductor substrate 10, including semiconductor element 11 for which the breakdown voltage is measured, with low boiling point fluorine inert fluids 31, 32 having a boiling point of 80° C. or lower.

In the breakdown voltage measuring method described above, the measurement of the breakdown voltage of semiconductor element 11 is implemented in the state where a surface of semiconductor element 11 is covered with high boiling point fluorine inert fluid 30 exhibiting a high insulation property. Therefore, generation of an electric discharge is suppressed during the measurement of the breakdown voltage, so that breaking of semiconductor element 11 can be prevented. Moreover, with use of high boiling point fluorine inert fluid 30, reduction of the fluid amount due to evaporation during the measurement of the breakdown voltage can be suppressed. Moreover, in the breakdown voltage measuring method described above, semiconductor substrate 10 is cleaned with low boiling point fluorine inert fluids 31, 32 after the measurement of the breakdown voltage of semiconductor element 11 is implemented. Therefore, the surface of the cleaned semiconductor substrate can be evenly dried faster than the case where organic cleaning and rinsing are applied to the semiconductor substrate. Consequently, a residue of a foreign object can be suppressed on the dried surface of semiconductor substrate 10. Thus, according to the breakdown voltage measuring method described above, generation of an electric discharge during the measurement of the breakdown voltage can be suppressed, and a residue of a foreign object on cleaned semiconductor substrate 10 can be suppressed.

Herein, the "fluorine inert fluid" is an insulating fluid including fluorocarbon having a carbon-fluorine bonding. This fluorine inert fluid includes, for example, Fluorinert (registered trademark), Noveck (registered trademark), Galden (registered trademark), and the like manufactured by Sumitomo 3M Limited.

(2) Preferably, in the breakdown voltage measuring method described above, the boiling point of low boiling point fluorine inert fluids 31, 32 is 65° C. or lower.

Accordingly, the surface of cleaned semiconductor substrate 10 can be evenly dried faster Consequently, a residue of a foreign object can be effectively suppressed on the dried surface of semiconductor substrate 10.

(3) Preferably, in the breakdown voltage measuring method described above, the step of cleaning includes an immersion cleaning step of cleaning semiconductor substrate 10 in a state where semiconductor substrate 10 is immersed in low boiling point fluorine inert fluid 31. Accordingly, the entire surface of semiconductor substrate 10 after the measurement of the breakdown voltage can be cleaned evenly with use of low boiling point fluorine inert fluid 31.

(4) Preferably, in the breakdown voltage measuring method described above, a temperature of low boiling point fluorine inert fluid 31 in which semiconductor substrate 10 is immersed in the immersion cleaning step is maintained at 40° C. or lower.

Accordingly, reduction of the fluid amount due to evaporation of low boiling point fluorine inert fluid 31 can be suppressed during cleaning of semiconductor substrate 10. Consequently, since the amount of use of low boiling point fluorine inert fluid 31 can be reduced, reduction of cost for the cleaning process can be achieved.

(5) Preferably, the breakdown voltage measuring method described above further includes, in addition to the immersion cleaning step, a vapor cleaning step of cleaning semiconductor substrate 10 by means of vapor 33 generated by evaporation of low boiling point fluorine inert fluids 31, 32. Accordingly, as compared to the case where only the immersion cleaning step is implemented, semiconductor substrate 10 can be cleaned so that the surface of semiconductor substrate 10 after the measurement of the breakdown voltage attains a cleaner state.

(6) Preferably, in the breakdown voltage measuring method described above, in the vapor cleaning step, semiconductor substrate 10 is cleaned by vapor 33 generated by evaporation of low boiling point fluorine inert fluid 31 used in the immersion cleaning step. In this manner, low boiling point fluorine inert fluid 31 used in the immersion cleaning can be used as fluid for the vapor cleaning. Consequently, the amount of use of low boiling point fluorine inert fluid 32 as a source of vapor 33 can be further reduced.

(7) Preferably, in the breakdown voltage measuring method described above, a diameter L1 of semiconductor substrate 10 is 150 mm or greater. According to the breakdown voltage measuring method described above, a residue of a foreign object on the dried surface can be suppressed also in semiconductor substrate 10 having a large size.

(8) Preferably, in the breakdown voltage measuring method described above, semiconductor element 11 includes a plurality of semiconductor chips 12 each having a quadrilateral shape with a side length (L2, L3) of 10 mm or less.

In the breakdown voltage measuring method described above, the measurement of the breakdown voltage is implemented in a state where a surface of semiconductor element 11 (semiconductor chip 12) is covered with high boiling point fluorine inert fluid 30 having a boiling point of 90° C. or higher. Therefore, even in the case where the size of semiconductor chip 12 is small, and a long time is taken for the breakdown voltage measurement due to a large number of semiconductor chips 12 formed in one semiconductor substrate 10, reduction of the fluid amount of high boiling point fluorine inert fluid 30 can be suppressed.

(9) A method for manufacturing a semiconductor device according to one form of the present invention includes the steps of preparing a semiconductor substrate 10 in which semiconductor element 11 is formed, and measuring a breakdown voltage of semiconductor element 11. In the step of measuring a breakdown voltage of semiconductor element 11, the breakdown voltage measuring method according to any one of the items (1) to (8) described above is implemented to measure the breakdown voltage of semiconductor element 11.

In the method for manufacturing a semiconductor device described above, since the breakdown voltage measuring method described above is used to measure the breakdown voltage of semiconductor element 11, a residue of a foreign object on cleaned semiconductor substrate 10 can be suppressed. Consequently, according to the method for manufacturing a semiconductor device described above, a yield of a semiconductor device can be improved.

Details of the Embodiments of the Present Invention

Next, a specific example of the embodiments of the present invention will be described with reference to the drawings.

Referring to FIG. 1, in a method for manufacturing a semiconductor device according to the present embodiment, the step of preparing a semiconductor substrate is firstly implemented as the step (S10). In this step (S10), referring to FIG. 3, semiconductor substrate 10 made of, for example, silicon carbide (SiC) is prepared. A diameter L1 of semiconductor substrate 10 is, for example, 150 mm (6 inches) or greater.

Moreover, in this step (S10), semiconductor substrate 10 made of silicon (Si) may be prepared. Moreover, semiconductor substrate 10 made of a wide band gap semiconductor, such as gallium nitride (GaN) or diamond, having a band gap larger than silicon may be prepared.

Next, the step of forming a semiconductor device is implemented as the step (S20). In this step (S20), referring to FIG. 4, semiconductor element 11 including a plurality of semiconductor chips 12 is formed in semiconductor substrate 10. Each of semiconductor chips 12 is, for example, a vertical MOSFET (Metal Oxide Semiconductor Field Effect Transistor), an IGBT (Insulated Gate Bipolar Transistor), or a diode. In the present embodiment, each of semiconductor chips 12 is a vertical MOSFET having a source pad electrode 20 and a gate pad electrode 21 on one surface 10A and having a drain electrode on the other main surface. This vertical MOSFET may be, for example, a trench MOSFET or a planar MOSFET.

Figure 4:
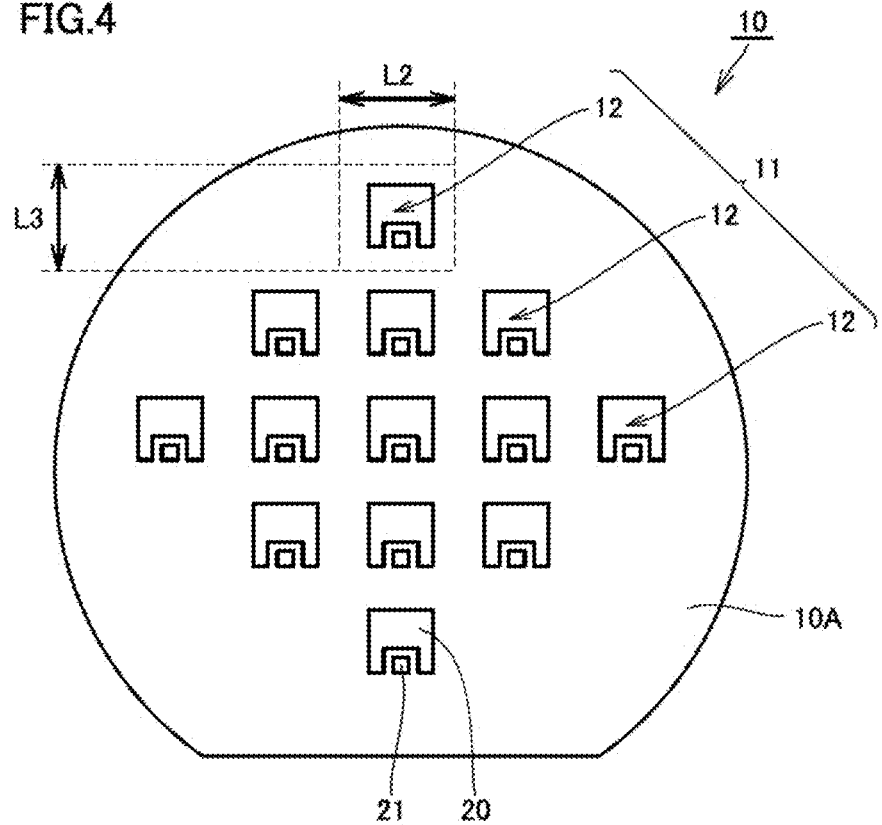
FIG. 4 is a schematic plan view representing a state where a semiconductor element is formed in the semiconductor substrate for use in the method for manufacturing the semiconductor device according to one embodiment of the present invention.

Referring to FIG. 4, semiconductor chip 12 has a quadrilateral shape with side lengths L2, L3 of 10 mm or less. Side lengths L2, L3 are not particularly limited, and it may be, for example, 6 mm or less, 3 mm or less, or 2 mm or less. By decreasing the size of semiconductor chip 12 in such a manner, a larger number of semiconductor chips 12 can be formed in the case where semiconductor substrate 10 having the same size is used. It should be noted that, since the measurement of the breakdown voltage is implemented with respect to each of semiconductor chips 12 in the step of measuring the breakdown voltage described later, a time required for the measurement of the breakdown voltage becomes longer proportionally to the number of semiconductor chips 12. By implementing the steps (S10) and (S20) described above in such a manner, semiconductor substrate 10 is prepared in which semiconductor element 11 including a plurality of semiconductor chips 12 is formed.

Next, the step of measuring the breakdown voltage of the semiconductor element is implemented as the step (S30). In this step (S30), the breakdown voltage measuring method according to the present embodiment including the steps (S31) to (S34) which will be described in the following is performed to measure the breakdown voltage of semiconductor element 11.

Figure 5:
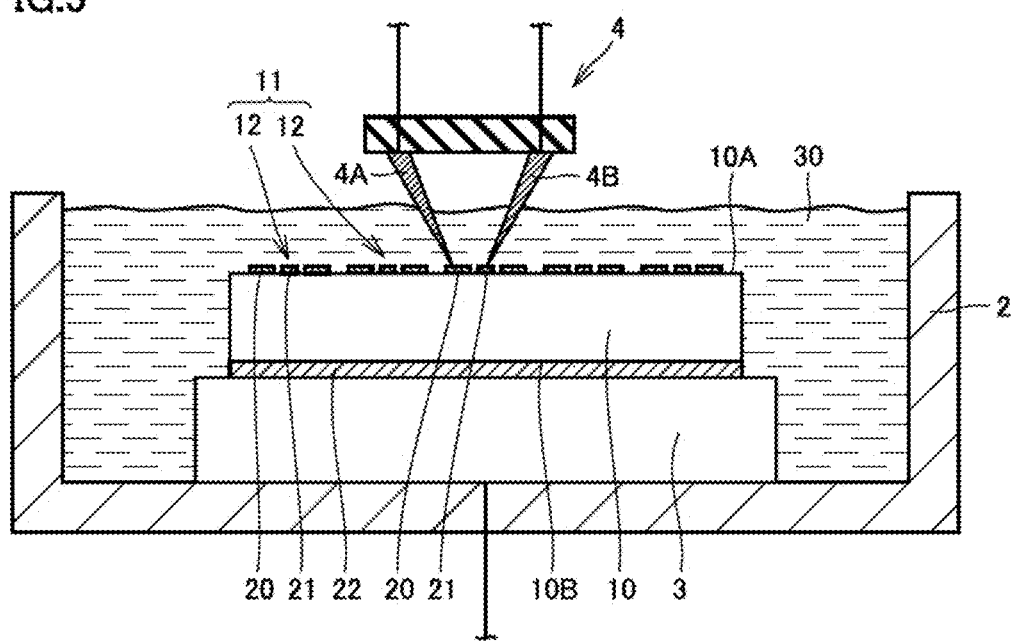
FIG. 5 is a schematic cross-sectional view for explanation of the breakdown voltage measuring method according to one embodiment of the present invention.

Firstly, the step of measuring the breakdown voltage is implemented as the step (S31) In this step (S31), referring to FIG. 5, a tray 2 filled with high boiling point fluorine inert fluid 30 is firstly prepared. A stage 3 is arranged at a bottom of tray 2. Next, semiconductor substrate 10, in which semiconductor element 11 including a plurality of semiconductor chip 12 is formed, is arranged on stage 3. In this manner, semiconductor substrate 10 is entirely immersed in high boiling point fluorine inert fluid 30 as shown in FIG. 5. Consequently, the surface of semiconductor element 11 (semiconductor chip 12) attains a state of being covered with high boiling point fluorine inert fluid 30. Moreover, as shown in FIG. 5, drain electrode 22 formed on the side of a back surface 10B of semiconductor substrate 10 comes into contact with stage 3.

Next, as shown in FIG. 5, a needle 4A of a probe 4 comes into contact with source pad electrode 20 formed on the side of surface 10A of semiconductor substrate 10, and a needle 4B comes into contact with gate pad electrode 21. Next, a predetermined voltage is applied between probe 4 and stage 3, and a value of a current flew at that time is measured. Then, the breakdown voltage of semiconductor element 11 is measured based on a reference of whether or not the measured current value exceeds a certain threshold value. This measurement of the breakdown voltage is implemented at a room temperature. After the measurement of the breakdown voltage described above is completed, semiconductor substrate 10 is taken out from high boiling point fluorine inert fluid 30.

High boiling point fluorine inert fluid 30 used in the step (S31) will be described now in detail. A boiling point of high boiling point fluorine inert fluid 30 is 90° C. or higher, preferably 120° C. or higher, more preferably 150° C. or higher. Moreover, a dielectric strength of high boiling point fluorine inert fluid 30 is 40 kV or higher (gap: 2.54 mm). Moreover, a vapor pressure (MPa) of high boiling point fluorine inert fluid 30 is $6.5 \times 10^{-3}$ or lower. Moreover, a kinetic viscosity (mm$^2$/s of high boiling point fluorine inert fluid 30 is 0.8 or higher.

Examples of high boiling point fluorine inert fluid 30 include, as shown in the following Table 1, for example, Fluorinert FC-770 (boiling point: 95° C.), Fluorinert FC-3283 (boiling point: 128° C.), Fluorinert FC-40 (boiling point: 155° C.), or Fluorinert FC-43 (boiling point: 174° C.) manufactured by Sumitomo 3M Limited. In this manner, by implementing the measurement of the breakdown voltage with use of high boiling point fluorine inert fluid 30 having a high insulating property, generation of a creeping discharge in semiconductor substrate 10 can be suppressed, and reduction of the fluid amount can be suppressed. It should be noted that, since the measurement of the breakdown voltage is implemented at a room temperature as described above, generation of hydrogen fluoride from high boiling point fluorine inert fluid 30 can be suppressed.

TABLE 1

| | Fluorinert FC-770 | Fluorinert FC-3283 | Fluorinert FC-40 | Fluorinert FC-43 |
| --- | --- | --- | --- | --- |
| Boiling Point (° C.) | 95 | 128 | 155 | 174 |
| Pour Point (° C.) | −127 | −50 | −57 | −50 |
| Density (25° C.) (kg/m$^3$) | 1790 | 1830 | 1870 | 1880 |

TABLE 1-continued

|  | Fluorinert FC-770 | Fluorinert FC-3283 | Fluorinert FC-40 | Fluorinert FC-43 |
|---|---|---|---|---|
| Density (−54° C.) (kg/m³) | 2004 | — | — | — |
| Kinetic Viscosity (25° C.) (mm²/s) | 0.8 | 0.8 | 2.2 | 2.8 |
| Kinetic Viscosity (−54° C.) (mm²/s) | 6 | — | — | — |
| Vapor Pressure (MPa) | $6.5 \times 10^{-3}$ | $1.3 \times 10^{-3}$ | $4.0 \times 10^{-3}$ | $1.7 \times 10^{-4}$ |
| Latent Heat of Evaporation (kJ/kg) | 86 | 84 | 71 | 71 |
| Specific Heat(J/kg · K) | 1038 | 1050 | 1050 | 1050 |
| Thermal Conductivity (W/mK) | 0.057 | 0.067 | 0.067 | 0.067 |
| Surface Tension (mN/m) | 15 | 16 | 16 | 16 |
| Refractive Index | 1.27 | 1.281 | 1.29 | 1.291 |

Next, by implementing the steps (S32) to (S34) sequentially, the surface of semiconductor substrate 10 after the breakdown voltage of semiconductor element 11 is measured is cleaned. Firstly, a configuration of a cleaning device 1 used in the steps (S32) to (S34) will be described with reference to FIG. 6.

Figure 6:
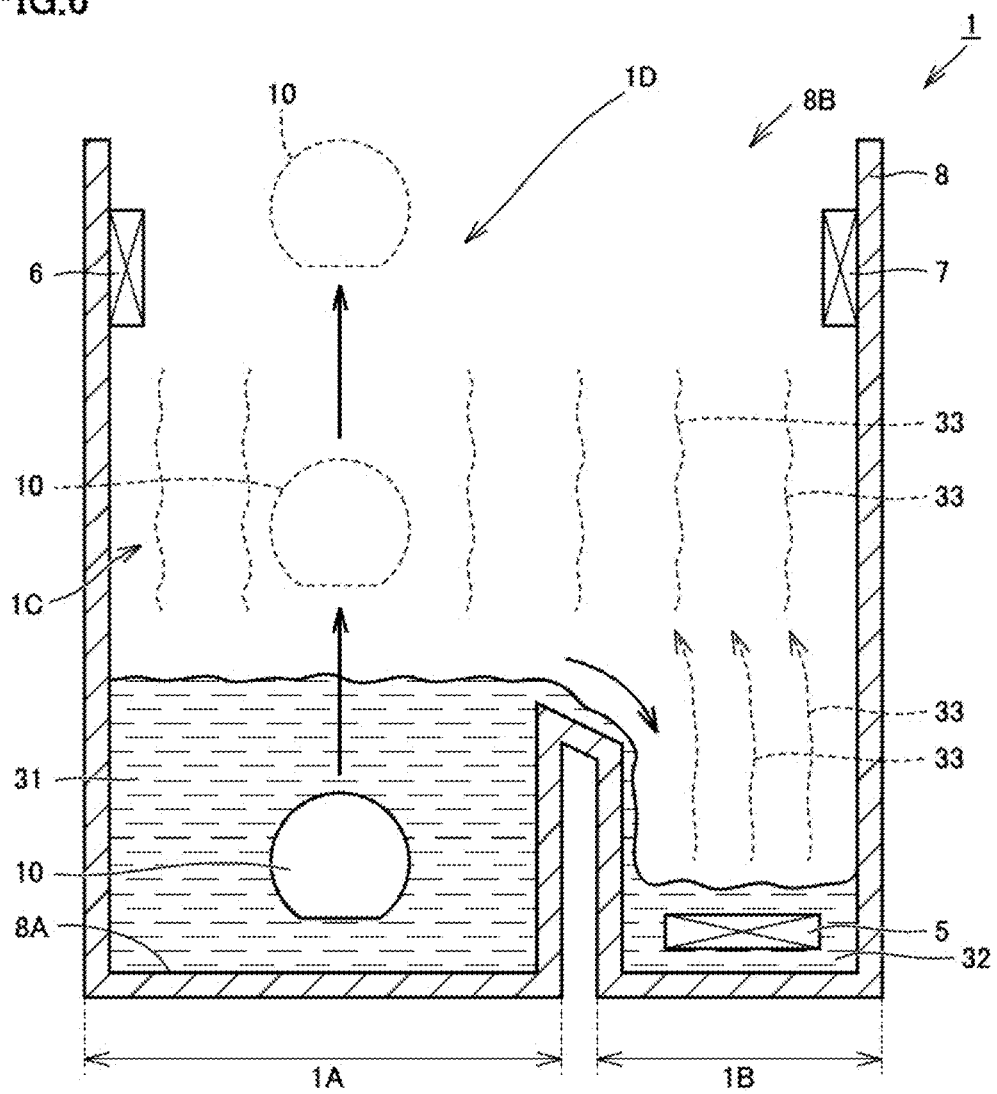
FIG. 6 is a schematic cross-sectional view for explanation of a cleaning process for the semiconductor substrate in the breakdown voltage measuring method according to one embodiment of the present invention.

Referring to FIG. 6, cleaning device 1 mainly has a cleaning vessel 8, a heater 5, and cooling coils 6, 7. Cleaning vessel 8 has a bottom portion 8A and an opening 8B. The side of bottom portion 8A of cleaning vessel 8 is filled with low boiling point fluorine inert fluids 31, 32 for cleaning semiconductor substrate 10. Moreover, cleaning vessel 8 is provided with an immersion cleaning portion 1A, a vapor generating portion 1B, a vapor cleaning portion 1C, and a drying portion 1D.

Immersion cleaning portion 1A is filled with low boiling point fluorine inert fluid 31. As shown in FIG. 6, immersion cleaning portion 1A is a portion for cleaning semiconductor substrate 10 by immersing semiconductor substrate 10 in low boiling point fluorine inert fluid 31.

Vapor generating portion 1B is a portion for generating vapor 33 by mainly heating low boiling point fluorine inert fluid 32. At the bottom portion of vapor generating portion 1B, heater 5 is arranged. Moreover, the bottom portion of vapor generating portion 1B is filled with low boiling point fluorine inert fluid 32 which is a source of vapor 33. Moreover, cleaning device 1 is configured so that low boiling point fluorine inert fluid 31 overflew from immersion cleaning portion 1A flows into the side of vapor generating portion 1B as indicated by the arrow in FIG. 6. In other words, in cleaning device 1, low boiling point fluorine inert fluid 31 used in immersion cleaning portion 1A can be used as liquid for replenishing low boiling point fluorine inert fluid 32 used in vapor generating portion 1B. Then, low boiling point fluorine inert fluids 31, 32 are heated with use of heater 5 in vapor generating portion 1B, so that vapor 33 can be generated.

Vapor cleaning portion 1C is a portion for performing cleaning of semiconductor substrate 10 by means of vapor generated in vapor generating portion 1B. Vapor 33 generated in vapor generating portion 1B is diffused to vapor cleaning portion 1C as shown in FIG. 6. On a side of opening 8B from vapor cleaning portion 1C, cooling coils 6, 7 for cooling vapor 33 are provided. Accordingly, vapor 33 diffused from vapor cleaning portion 1C to the side of opening 8B is liquefied, and can be returned to immersion cleaning portion 1A or vapor generating portion 1B again as low boiling point fluorine inert fluids 31, 32. Drying portion 1D is a portion for performing a drying process for cleaned semiconductor substrate 10, and is provided on the side of opening 8B from vapor cleaning portion 1C.

Next, the cleaning process of semiconductor 10 with use of cleaning device 1 described above will be described. Firstly, the immersion cleaning step is implemented as the step (S32). In this step (S32), referring to FIG. 6, semiconductor substrate 10 is immersed in low boiling point fluorine inert fluid 31 filling immersion cleaning portion 1A. Then, an ultrasonic low treatment or the like is implemented in the state of being immersed in boiling point fluorine inert fluid 31, so that semiconductor substrate 10 is cleaned.

In this step (S32), the temperature of low boiling point fluorine inert fluid 31 in which semiconductor substrate 10 is immersed is maintained at, for example, 40° C. or lower. More specifically, cooling coil 6 is used to adjust the temperature of low boiling point fluorine inert fluid 31 to be within the range described above. Accordingly, evaporation of low boiling point fluorine inert fluid 31 is suppressed during the cleaning of semiconductor substrate 10, so that reduction of the fluid amount can be suppressed consequently.

Next, the vapor cleaning step is implemented as the step (S33). In this step (S33), referring to FIG. 6, semiconductor substrate 10 cleaned in immersion cleaning portion 1A is moved to vapor cleaning portion 1C as indicated by the arrow in FIG. 6. Vapor cleaning portion 1C is filled with vapor 33 generated by evaporation of low boiling point fluorine inert fluids 31, 32 in vapor generating portion 1B. Vapor 33 is generated by heating low boiling point fluorine inert fluids 31, 32 at a temperature of, for example, 55° C. or higher and 60° C. or lower. Then, the surface of semiconductor substrate 10 is cleaned by vapor 33.

In this step (S33), the surface of semiconductor substrate 10 may be cleaned by vapor 33 generated by evaporation of low boiling point fluorine inert fluid 31 flew from immersion cleaning portion 1A to vapor generating portion 1B in addition to vapor 33 generated by evaporation of low boiling point fluorine inert fluid 32 filling the bottom portion of vapor generating portion 1B. In other words, low boiling point fluorine inert fluid 31 used in the immersion cleaning step (S32) described above may be used as fluid for supplementing low boiling point fluorine inert fluid 32. In this manner, by effectively utilizing low boiling point fluorine inert fluid 31, the amount of use of low boiling point fluorine inert fluid 32 can be reduced. In this case, the temperature difference of low boiling point fluorine inert fluid 31, 32 is small. Preferably, the temperature difference is, for example, 20° C. or lower.

Next, the drying step is implemented as the step (S34). In this step (S34), referring to FIG. 6, semiconductor substrate 10 after being cleaned by vapor is transferred from vapor cleaning portion 1C to drying portion 1D. Vapor 33 is cooled and liquefied by cooling coils 6, 7 before being diffused to drying portion 1D as described above, and then returned again to immersion cleaning portion 1A or vapor generating portion 1B. Therefore, the drying process of semiconductor substrate 10 can be performed by transferring semiconductor substrate 10 to drying portion 1D.

Herein, low boiling point fluorine inert fluids 31, 32 used in the steps (S32) and (S33) will be described in detail. The boiling point of low boiling point fluorine inert fluids 31, 32 is lower than the boiling point of high boiling point fluorine inert fluid 30. The boiling point of low boiling point fluorine inert fluids 31, 32 is 80° C. or lower, preferably 65° C. or lower, or more preferably 55° C. or lower. Moreover, the vapor pressure (MPa) of low boiling point fluorine inert fluids 31, 32 is, for example, $2.5 \times 10^{-2}$ or higher. Moreover, the kinetic viscosity (mm²/s) of low boiling point fluorine inert fluids 31, 32 is 0.4 or lower.

As shown in the following Table 2, examples of low boiling point fluorine inert fluids 31, 32 include, for example, PF-5052 (boiling point: 50° C.), Fluorinert FC-72 (boiling point: 56° C.), Noveck 7100 (boiling point: 61° C.), or Noveck 71IPA (boiling point: 54.5° C.) manufactured by Sumitomo 3M Limited. It should be noted that, Table 2, the viscosity value of Noveck 71IPA is given as an absolute viscosity (Pa S) rather than the kinetic viscosity (mm²/s). In this manner, by cleaning substrate 10 with use of low boiling point fluorine inert fluids 31, 32 after the measurement of the breakdown voltage, a residue of a foreign object on cleaned semiconductor substrate 10 can be suppressed. By implementing the steps (S31) to (S34) in the manner described above, the measurement of the breakdown voltage, the cleaning process, and the drying process are implemented for semiconductor element 11, so that the breakdown voltage measuring method according to the present embodiment is completed.

TABLE 2

|  | PF-5052 | Fluorinert FC-72 | Noveck 7100 | Noveck 711PA |
| --- | --- | --- | --- | --- |
| Boiling Point (° C.) | 50 | 56 | 61 | 54.5 |
| Pour Point (° C.) | −80 | −90 | — | — |
| Density (25° C.) (kg/m³) | 1700 | 1680 | 1520 | 1440 |
| Density (−54° C.) (kg/m³) | — | 1900 | — | — |
| Kinetic Viscosity (25° C.) (mm²/s) | 0.4 | 0.4 | 0.38 | $6.8 \times 10^{-4}$ |
| Kinetic Viscosity (−54° C.) (mm²/s) | — | 1.9 | — | — |
| Vapor Pressure (MPa) | $3.7 \times 10^{-2}$ | $3.1 \times 10^{-2}$ | $2.8 \times 10^{-2}$ | — |
| Latent Heat of Evaporation (kJ/kg) | 105 | 88 | 126 | — |
| Specific Heat(J/kg · K) | 1050 | 1050 | 1172 | — |
| Thermal Conductivity (W/mK) | 0.059 | 0.059 | 0.069 | — |
| Surface Tension (mN/m) | 13 | 12 | 13.6 | 14 |
| Refractive Index | — | 1.251 | 1.27 | — |

Figure 7:
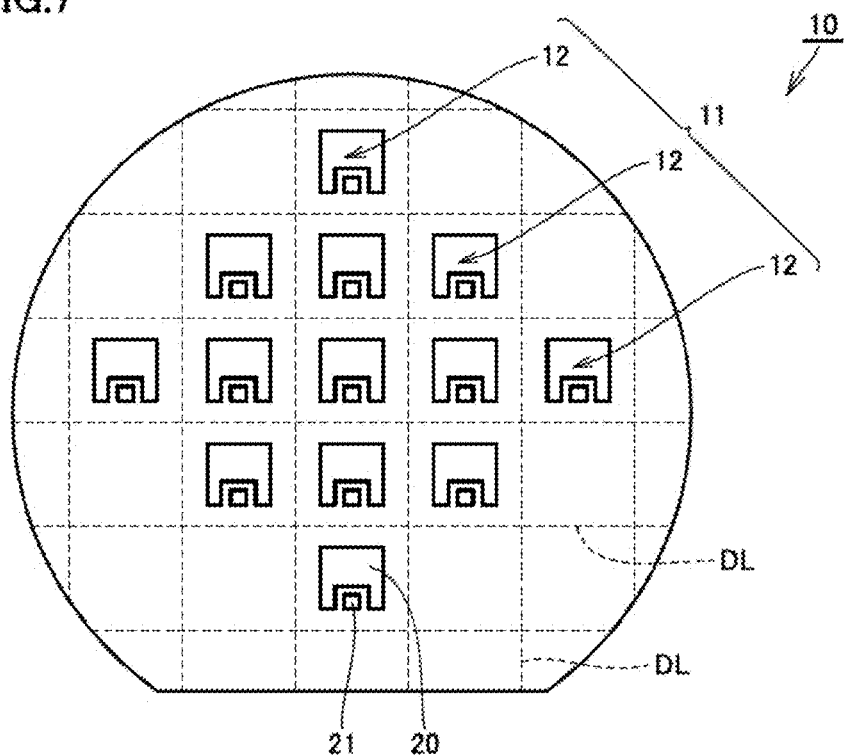
FIG. 7 is a schematic plan view for explanation of division of the semiconductor substrate into semiconductor chips in the method for manufacturing the semiconductor device according to one embodiment of the present invention.

Referring back to the method for manufacturing a semiconductor device according to the present embodiment (FIG. 1), the step of dividing into semiconductor chips is implemented as the step (S40) after the step (S30). In this step (S40), referring to FIG. 7, semiconductor substrate 10 for which the measurement of the breakdown voltage of semiconductor element 11 is completed is cut along the dicing lines DL indicated by broken lines in FIG. 7. Accordingly, semiconductor substrate 10 is divided into a plurality of semiconductor chips 12. In the manner as described above, the steps (S10) to (S40) are implemented, so that the method for manufacturing a semiconductor device according to the present embodiment is completed.

Next, the effects of the breakdown voltage measuring method and the method for manufacturing a semiconductor device according to the present embodiment will be described. In the breakdown voltage measuring method described above, the measurement of the breakdown voltage of semiconductor element 11 is implemented in the state where the surface of semiconductor element 11 is covered with high boiling point fluorine inert fluid 30 having a high insulating property (FIG. 5). Therefore, generation of an electric discharge during the measurement of the breakdown voltage is suppressed, so that breaking of semiconductor element 11 can be prevented. Moreover, with use of high boiling point fluorine inert fluid 30, reduction of the fluid amount due to evaporation during the measurement of the breakdown voltage can be suppressed. Moreover, in the breakdown voltage measuring method described above, after the measurement of the breakdown voltage of semiconductor element 11 is implemented, semiconductor substrate 10 is cleaned by low boiling point fluorine inert fluids 31, 32 (FIG. 6). Therefore, as compared to the case where the organic cleaning and the rinsing are sequentially implemented with respect to semiconductor substrate 10, the surface of the semiconductor substrate can be dried faster and more evenly. Consequently, a residue of a foreign object on the dried surface of semiconductor substrate 10 can be suppressed. Further, being different from the case where the rinsing is performed with respect to semiconductor substrate 10, generation of a watermark on the surface of semiconductor substrate 10 can be suppressed.

Figure 8:
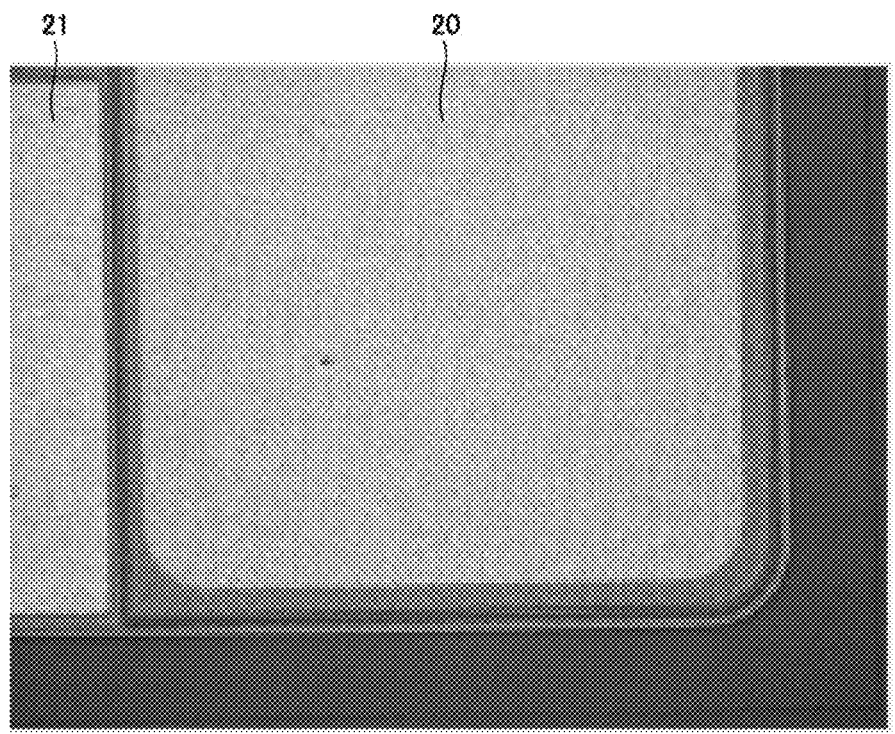
FIG. 8 is a photograph representing a state of a dried surface of the semiconductor substrate in the Example.
Figure 9:
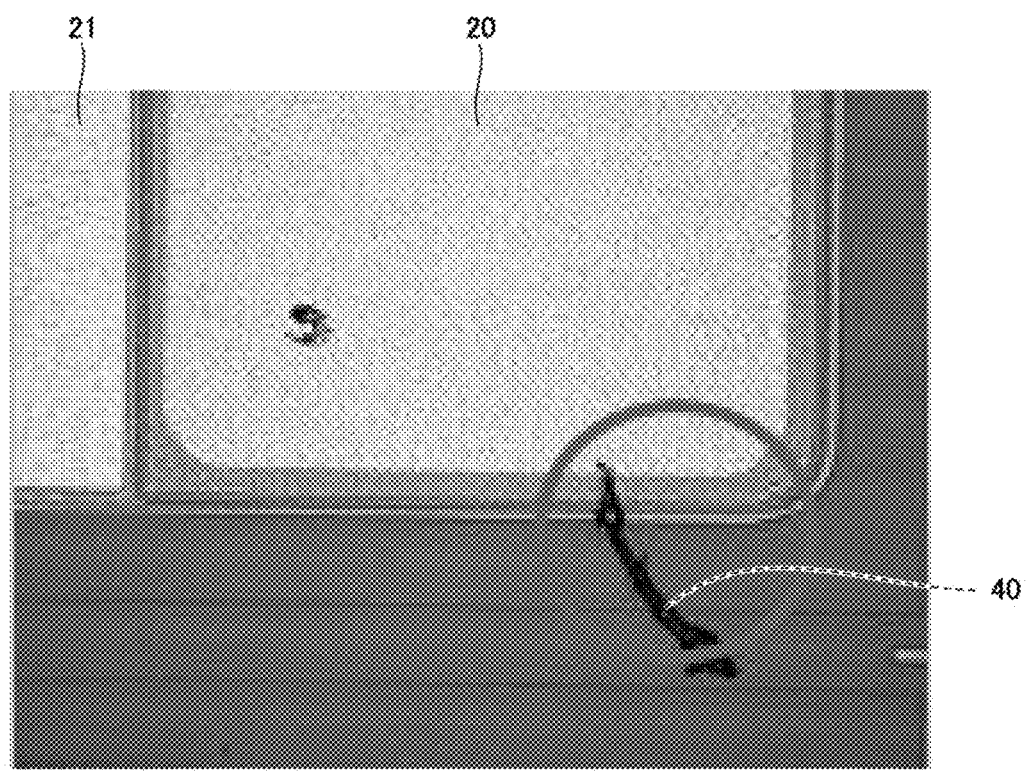
FIG. 9 is a photograph representing a state of a dried surface of the semiconductor substrate in the Comparative Example.

FIG. 8 is a photograph representing a state of the surface of the substrate after semiconductor substrate 10 is cleaned with use of low boiling point fluorine inert fluids 31, 32 (Noveck 7100). Moreover, FIG. 9 is a photograph representing a state of the substrate in the case where the organic cleaning and the rinsing are performed with respect to the semiconductor substrate FIGS. 8 and 9 are photographs of the portions on surface 10A of semiconductor substrate 10 where source pad electrode 20 and gate pad electrode 21 are formed. As is apparent from the comparison between the photographs of FIGS. 8 and 9, a residue of a foreign object 40 on the cleaned substrate surface can be suppressed by cleaning semiconductor substrate 10 with use of low boiling point fluorine inert fluids 31, 32 in the manner of the breakdown voltage measuring method according to the present embodiment. In this manner, with the breakdown voltage measuring method according to the present embodiment, generation of an electric discharge during the measurement of the breakdown voltage can be suppressed, and a residue of a foreign object on cleaned semiconductor substrate 10 can be suppressed. Moreover, with the method for manufacturing a semiconductor device according to the present embodiment in which the breakdown voltage measuring method described above is implemented, a yield of the semiconductor device can be improved.

In the embodiment described above, the exemplary case is described in which the measurement of the breakdown voltage is implemented in the state where entire semiconductor substrate 10 is immersed in high boiling point fluorine inert fluid 30 in the step (S31). However, other embodiment is also possible. For example, the measurement of the breakdown voltage may be implemented in the state where high boiling point fluorine inert fluid 30 is applied by potting so as to cover only a part of surface 10A of semiconductor substrate 10 (a part on which semiconductor chip 12 subjected to implementation of the measurement of the breakdown voltage). Moreover, in the embodiment described above, the exemplary case was described in which semiconductor substrate 10 after the measurement of the breakdown voltage is cleaned by immersion cleaning and vapor cleaning in the steps (S32) and (S33). However, other embodiment employing a suitable cleaning method with use of low boiling point fluorine inert fluid is also possible.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A breakdown voltage measuring method comprising the steps of:
   measuring a breakdown voltage of a semiconductor element in a state where a surface of said semiconductor element formed in a semiconductor substrate is covered with a high boiling point fluorine inert fluid having a boiling point of 90° C. or higher; and
   cleaning said semiconductor substrate, including said semiconductor element for which the breakdown voltage is measured, with a low boiling point fluorine inert fluid having a boiling point of 80° C. or lower,
   wherein said step of cleaning includes an immersion cleaning step of cleaning said semiconductor substrate in a state where said semiconductor substrate is immersed in said low boiling point fluorine inert fluid, and
   wherein said step of cleaning further includes, in addition to said immersion cleaning step, a vapor cleaning step of cleaning said semiconductor substrate by means of vapor generated by evaporation of said low boiling point fluorine inert fluid.

2. The breakdown voltage measuring method according to claim 1, wherein said boiling point of said low boiling point fluorine inert fluid is 65° C. or lower.

3. The breakdown voltage measuring method according to claim 1, wherein a temperature of said low boiling point fluorine inert fluid in which said semiconductor substrate is immersed in said immersion cleaning step is maintained at 40° C. or lower.

4. The breakdown voltage measuring method according to claim 1, wherein in said vapor cleaning step, said semiconductor substrate is cleaned by said vapor generated by evaporation of said low boiling point fluorine inert fluid used in said immersion cleaning step.

5. The breakdown voltage measuring method according to claim 1, wherein a diameter of said semiconductor substrate is 150 mm or greater.

6. The breakdown voltage measuring method according to claim 1, wherein said semiconductor element includes a plurality of semiconductor chips each having a quadrilateral shape with a side length of 10 mm or less.

7. A method for manufacturing a semiconductor device, comprising the steps of:
   preparing a semiconductor substrate in which a semiconductor element is formed; and
   measuring a breakdown voltage of said semiconductor element,
   in said step of measuring a breakdown voltage of said semiconductor element, the breakdown voltage measuring method according to claim 1 being implemented to measure said breakdown voltage of said semiconductor element.

* * * * *